(12) United States Patent
Daghighian et al.

(10) Patent No.: US 9,103,725 B2
(45) Date of Patent: Aug. 11, 2015

(54) SYSTEM AND METHOD OF ELECTROMAGNETIC RADIATION CONTROL

(71) Applicant: FINISAR CORPORATION, Sunnyvale, CA (US)

(72) Inventors: Henry Meyer Daghighian, Menlo Park, CA (US); The'Linh Nguyen, San Jose, CA (US); Chris Kocot, San Carlos, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 368 days.

(21) Appl. No.: 13/761,328

(22) Filed: Feb. 7, 2013

(65) Prior Publication Data

US 2013/0200250 A1    Aug. 8, 2013

Related U.S. Application Data

(60) Provisional application No. 61/596,456, filed on Feb. 8, 2012.

(51) Int. Cl.
*G01J 1/44* (2006.01)
*G01R 29/08* (2006.01)
*G01R 31/00* (2006.01)
*H04B 15/00* (2006.01)
*H04B 15/04* (2006.01)
*G02B 6/42* (2006.01)

(52) U.S. Cl.
CPC . *G01J 1/44* (2013.01); *G01R 29/08* (2013.01); *G01R 31/001* (2013.01); *H04B 15/00* (2013.01); *H04B 15/04* (2013.01); *G02B 6/4277* (2013.01)

(58) Field of Classification Search
CPC ....... H04B 15/00; H04B 15/04; G02B 6/4277
USPC ........... 250/205, 206; 356/369; 398/137, 154, 398/162
See application file for complete search history.

(56) References Cited

U.S. PATENT DOCUMENTS 6,121,993 A  *  9/2000  Maekawara et al. .......... 347/236
6,490,302 B1 * 12/2002  Koishi et al. ............... 372/38.02
6,781,105 B2 *  8/2004  Yokoi ......................... 250/201.5
6,999,838 B2 *  2/2006  Roddy et al. .................. 700/166

* cited by examiner

*Primary Examiner* — Seung C Sohn
(74) *Attorney, Agent, or Firm* — Maschoff Brennan (57) ABSTRACT

A method of compensating for electromagnetic radiation. The method may include measuring electromagnetic radiation emanating from circuitry at a first frequency and adjusting at least one of the electrical settings of the circuitry based on the measurement of the electromagnetic radiation to reduce the electromagnetic radiation at the first frequency emanating from the circuitry.

20 Claims, 7 Drawing Sheets

SYSTEM AND METHOD OF ELECTROMAGNETIC RADIATION CONTROL

CROSS-REFERENCE TO RELATED APPLICATIONS

This patent application claim priority to U.S. Provisional Patent Application No. 61/596,456, filed on Feb. 8, 2012, which is incorporated herein by reference in its entirety.

BACKGROUND

Data communication systems have been under continual development for many years. Within different types of communication systems, different respective communication channels may be implemented using different types of media. For example, some communication channels may use optical media and optical modules to communicate information.

Unfortunately, with increasing data rates within data communication systems, electromagnetic interference generated by the components within the data communication systems has increased. In some instances, the electromagnetic interference generated by the components may reach unacceptable levels based on industry or governmental standards or based on the electromagnetic interference interfering with the operation of other components within the data communication system. In some instances, such as in optical modules, the components causing the electromagnetic interference may not be able to be shielded to prevent the electromagnetic interference from interfering with other components or reaching unacceptable levels outside these electromagnetic interference generating components.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

Some example embodiments generally relate to electromagnetic radiation control.

In an embodiment, a method of compensating for electromagnetic radiation is described. The method may include measuring electromagnetic radiation emanating from circuitry at a first frequency and adjusting at least one of the electrical settings of the circuitry based on the measurement of the electromagnetic radiation to reduce the electromagnetic radiation at the first frequency emanating from the circuitry.

In an embodiment, a system for compensating for electromagnetic radiation is described. The system may include circuitry configured to receive signals from or to transmit signals to an optical subassembly and an electromagnetic radiation detection module configured to detect electromagnetic radiation emanated from the circuitry and measure the electromagnetic radiation. The system may also include a control module configured to control electrical settings of the circuitry. The control module may be further configured to adjust at least one of the electrical settings of the circuitry to reduce the electromagnetic radiation emanating from the circuitry based on the measurement of the electromagnetic radiation.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the invention will be set forth in the description that follows or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

A more particular description of the invention will be rendered by reference to embodiments thereof, which are illustrated in the appended drawings. It is appreciated that these drawings depict only some embodiments of the invention and are therefore not to be considered limiting of its scope. The invention will be described and explained with additional specificity and detail through the use of the accompanying drawings in which.

DETAILED DESCRIPTION

Figure 1:
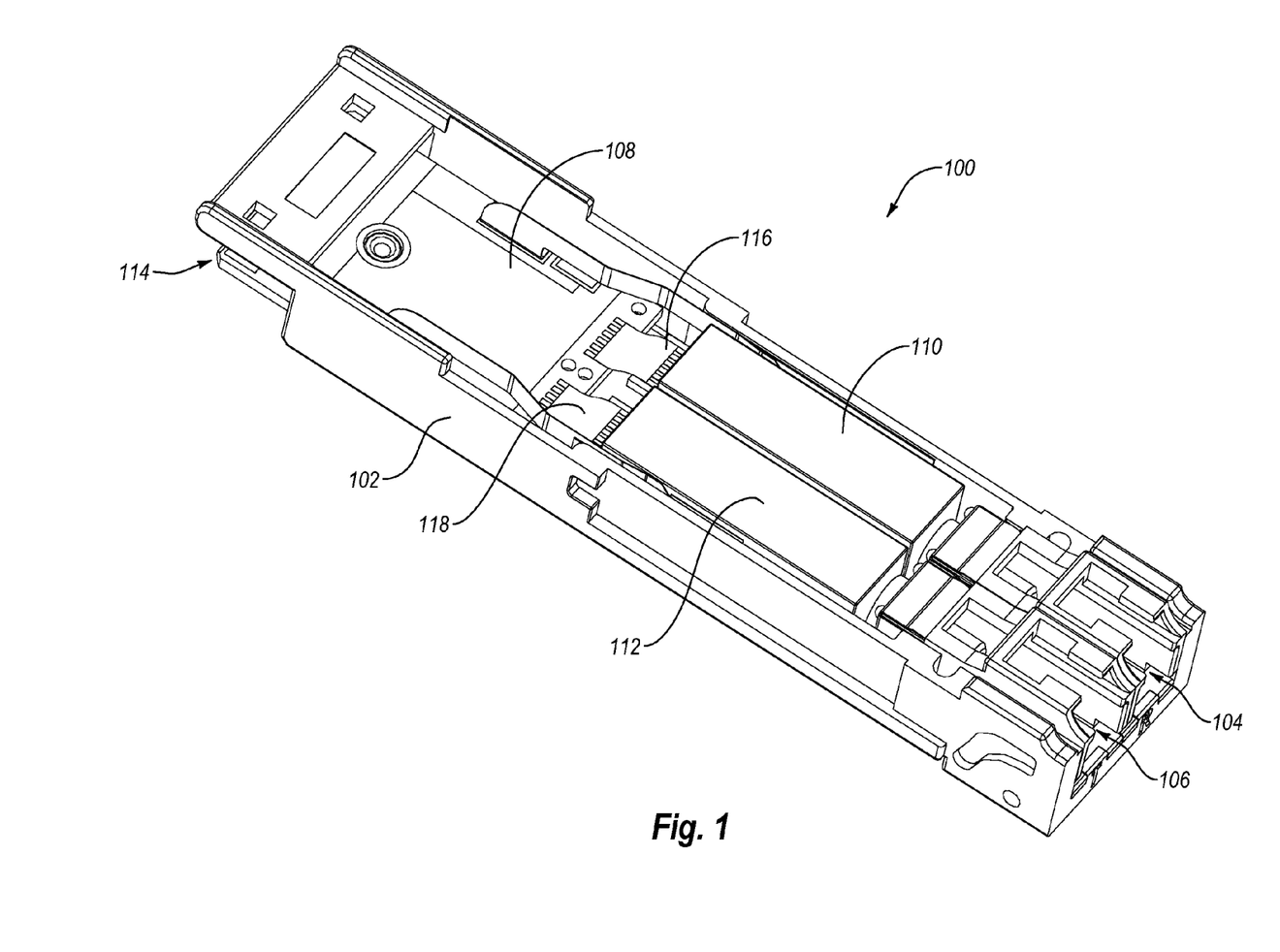
FIG. 1 illustrates a perspective view of an optoelectronic module.

FIG. 1 illustrates a perspective view of an optoelectronic module 100 (hereinafter "module 100") for use in transmitting and receiving optical signals to and from an optical network in connection with a host device (not shown) to which the module 100 may be electrically coupled, arranged in accordance with at least some embodiments described herein. As illustrated, the module 100 includes various components, including a bottom housing 102; a receive port 104 and a transmit port 106, both defined in the bottom housing 102; a printed circuit board (PCB) 108 positioned within the bottom housing 102; and a receiver optical subassembly (ROSA) 110 and a transmitter optical subassembly (TOSA) 112 also positioned within the bottom housing 102. An edge connector 114 is located on an end of the PCB 108 to enable the module 100 to electrically interface with the host device. As such, the PCB 108 may facilitate electrical communication between the host device and the ROSA 110 and TOSA 112.

The module 100 may be configured for optical signal transmission and reception at a variety of data rates including, but not limited to, 2.5 Gb/s, 5 GB/s, 20 Gb/s, 40 Gb/s, 100 Gb/s, or higher. Furthermore, the module 100 may be configured for optical signal transmission and reception at various distinct wavelengths using wavelength division multiplexing (WDM). In WDM, multiple optical signals having distinct wavelengths are multiplexed onto a single optical fiber. For example, the module 100 may be configured to operate using one of various WDM schemes, such as Coarse WDM, Dense WDM, or Light WDM. Furthermore, the module 100 may be configured to support various communication protocols including, but not limited to, Fibre Channel and High Speed Ethernet. In addition, the module 100 may be configured in a variety of different form factors including, but not limited to, the C Form-factor Pluggable (CFP) and the Quad Small Form-factor Pluggable (QSFP) multi-source agreements.

With continued reference to FIG. 1, the ROSA 110 may house one or more optical receivers, such as photodiodes, that are electrically coupled to an electrical interface 116. The TOSA 112 may house one or more optical transmitters, such as lasers, that are electrically coupled to another electrical interface 118. The one or more optical receivers may be configured to convert optical signals received through the receive port 104 into corresponding electrical signals that are relayed to the PCB 108 through the electrical interface 116. The one or more optical transmitters may be configured to convert electrical signals received through the PCB 108 by way of the electrical interface 118 into corresponding optical signals that are transmitted through the transmit port 106. Accordingly, the ROSA 110 may serve as an optical-electronic transducer and the TOSA 112 may serve as an electronic-optical transducer. The optical ports 104, 106 may be configured to receive optical fiber connectors such as LC or SC connectors (not shown) to optically connect the ROSA 110 and the TOSA 112, respectively, with optical fibers or a single optic fiber.

The module 100 illustrated with respect to FIG. 1 is one architecture in which embodiments of the present disclosure may be employed. Note that this specific architecture is only one of countless architectures in which embodiments described herein may be employed. The scope of the present disclosure is not intended to be limited to any particular architecture or environment.

Figure 2:
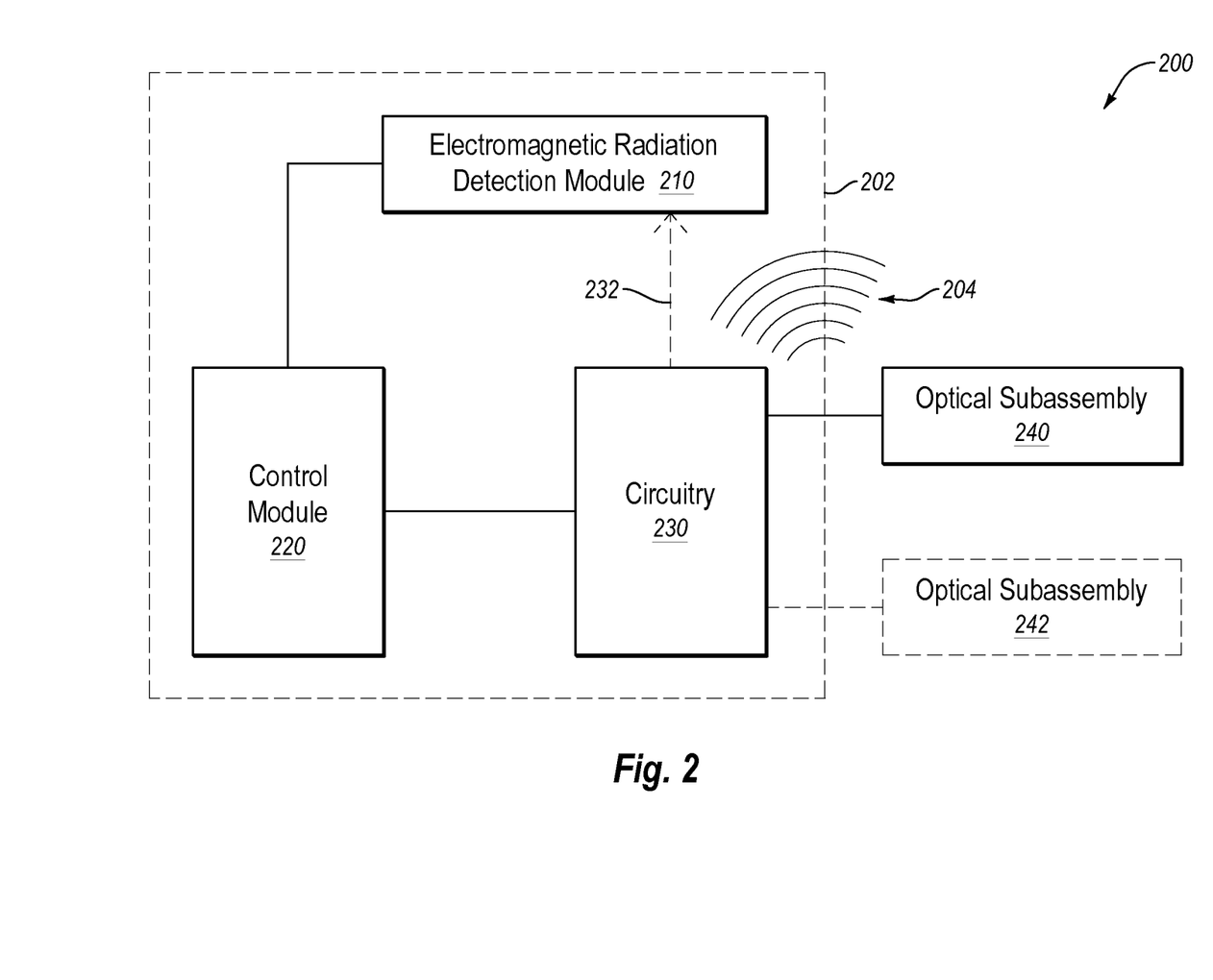
FIG. 2 illustrates an electromagnetic radiation compensation system.

FIG. 2 illustrates an electromagnetic radiation compensation system 200 (hereinafter "system 200"), arranged in accordance with at least some embodiments described herein. The system 200 may include an electromagnetic radiation detection module 210, a control module 220, circuitry 230, and an optical subassembly 240. In some embodiments, the system 200 may form part of an optoelectronic module, such as the module 100 of FIG. 1. For example, in some embodiments, the electromagnetic radiation detection module 210, the control module 220, and the circuitry 230 may be coupled to a single PCB 202, which may correspond to the PCB 108 illustrated in FIG. 1. In other embodiments, the electromagnetic radiation detection module 210, the control module 220, and the circuitry 230 may be coupled to separate PCB boards that are communicatively coupled.

The circuitry 230 may include one or more components; such as an E-O modulator; drivers, such as a EML, Mach-Zehnder, LiNOB3, silicon photonic ring modulator, laser diode, or a VCSEL; signal amplifiers such as variable gain amplifiers and limiting amplifiers; clock and data recovery components; and/or other components that may be configured to receive signals from or transmit signals to the optical subassembly 240 as well as provide other electrical signals for the optical subassembly 240. For example, in some embodiments, the optical subassembly 240 may be a TOSA. In these and other embodiments, the circuitry 230 may be configured to condition electrical signals for optical transmission and provide other electrical signals for the TOSA. In other embodiments, the optical subassembly 240 may be a ROSA. In these and other embodiments, the circuitry 230 may be configured to receive and condition electrical signals from the ROSA and provide other electrical signals for the ROSA.

In some embodiments, the system 200 may include another optical subassembly 242. In these and other embodiments, the optical subassembly 240 may be a TOSA and the optical subassembly 242 may be a ROSA. The circuitry 230 may be configured to condition electrical signals for optical transmission by the TOSA and to receive and condition electrical signals from the ROSA.

The control module 220 may include one or more components, such as memory, processors, microprocessors, microcontrollers, field programmable gate arrays, digital logic, digital to analog converters, analog to digital converters, and/or other components that may be used to control electrical settings and/or other settings of the circuitry 230, send signals to and/or receive signals from the circuitry 230, or otherwise interact with the circuitry 230. For example, in some embodiments, the control module 220 may be configured to configure the circuitry 230 when the system 200 is powered on. Additionally or alternately, the control module 220 may be configured to monitor the circuitry 230 during operation of the system 200 and/or to adjust settings of the circuitry 230 to optimize dynamically varying performance of the system 200.

In some embodiments, the control module 220 may be configured to control voltage biasing levels for the circuitry 230. Additionally or alternately, the control module 220 may be configured to control an amplitude level of transmitted signals and/or received signals within the circuitry 230. Additionally or alternately, the control module 220 may be configured to control signal rise and/or fall times for transmitted and/or received signals within the circuitry 230. Additionally or alternately, the control module 220 may be configured to adjust electrical cross point levels for signal transmissions or received signals within the circuitry 230. Additionally or alternately, the control module 220 may be configured to adjust signal overshoot or undershoot within the circuitry 230. Additionally or alternately, the control module 220 may be configured to adjust other types of receiver sensitivity within the circuitry 230. Additionally or alternately, the control module 220 may be configured to adjust other electrical settings within the circuitry 230. In these and other embodiments, adjusting the electrical setting within the circuitry 230 may adjust an ability of the circuitry 230 to extract data from a signal received by the circuitry 230 or transmit by the circuitry 230 a signal with data.

The electromagnetic radiation detection module 210 may be configured to detect electromagnetic radiation 204 emanating from the circuitry 230 and/or optical subassembly 240 (and/or 242) and measure the electromagnetic radiation 204. In some embodiments, the electromagnetic radiation detection module 210 may measure an amplitude or field intensity of the electromagnetic radiation 204. The electromagnetic radiation detection module 210 may send the measurement of the electromagnetic radiation 204, such as the amplitude of the electromagnetic radiation 204, to the control module 220. In some embodiments, the electromagnetic radiation detection module 210 may measure the electromagnetic radiation 204 at a specific frequency or frequency window. In some embodiments, the electromagnetic radiation detection module 210 may measure a highest amplitude or field intensity of electromagnetic radiation 204 emanating from the circuitry 230.

In some embodiments, electromagnetic radiation emanating from the circuitry 230, may have an amplitude or field intensity that is highest at a frequency equal to the clocking frequency of the circuitry 230. Other high amplitudes of electromagnetic radiation emanating from the circuitry 230 may be at frequencies that are harmonics of the clock frequency. In these and other embodiments, the electromagnetic radiation detection module 210 may measure the amplitude of the electromagnetic radiation 204 at a frequency equal to the clock frequency of the circuitry 230. For example, if the clock frequency of the circuitry 230 is 10 GHz, the electromagnetic radiation detection module 210 may measure the amplitude of electromagnetic radiation 204 at 10 GHz.

In some embodiments, the electromagnetic radiation detection module 210 may receive a clock signal 232 from the circuitry 230 for use in measuring the amplitude of the electromagnetic radiation 204 at a frequency equal to the frequency of the clock signal 232 (hereinafter "clock frequency"). Additionally or alternatively, the electromagnetic radiation detection module 210 may measure the amplitude of the electromagnetic radiation 204 at multiple frequencies. For example, the electromagnetic radiation detection module 210 may measure the amplitude of the electromagnetic radiation 204 at the clock frequency of the circuitry 230 and at various harmonics of the clock frequency of the circuitry 230.

The control module 220 may receive the measurement, such as the amplitude, of the detected electromagnetic radiation 204 from the electromagnetic radiation detection module 210. Based on the measurement of the detected electromagnetic radiation 204, the control module 220 may perform one or more actions. For example, in some embodiments, when the measurement is an amplitude of the electromagnetic radiation 204 and the amplitude is above a predetermined threshold, the control module 220 may send an alert to a user. The alert may indicate the amplitude of the detected electromagnetic radiation 204 and/or may indicate that the electromagnetic radiation 204 is above the predetermined threshold. Additionally or alternatively, the control module 220 may power-down the system 200 or adjust the electrical settings of the circuitry 230 to reduce the electromagnetic radiation from the circuitry 230 and/or optical subassembly 240. Some example electrical settings may include modulation levels, signal amplitude levels, electrical cross point levels, signal rise time, signal fall time, signal overshoot, signal undershoot, receiver sensitivity, or voltage biasing levels.

Figure 6A:
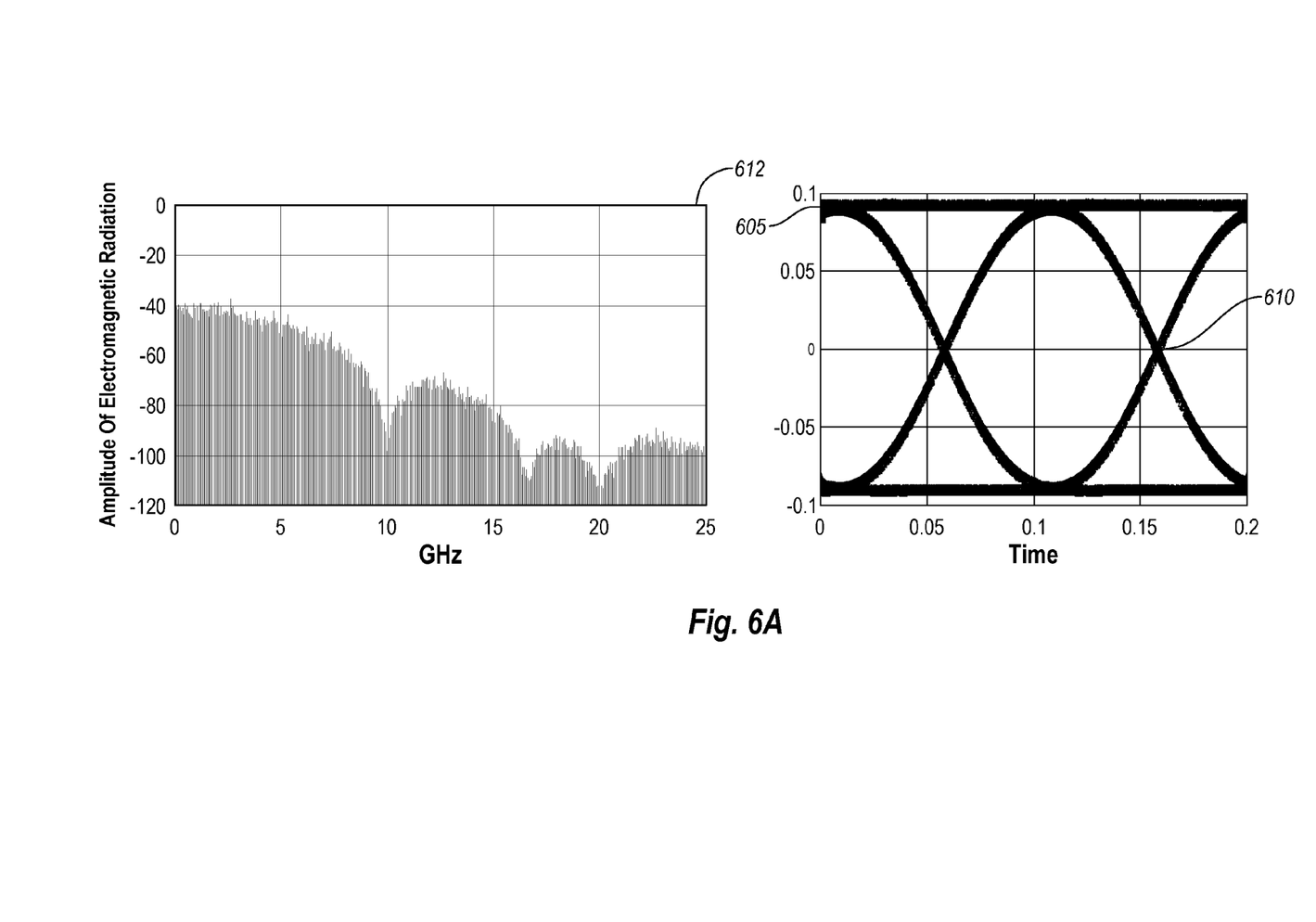
FIG. 6A illustrates a depiction of an electrical cross point level for a transmission signal and its associated electromagnetic radiation output profile.
Figure 6B:
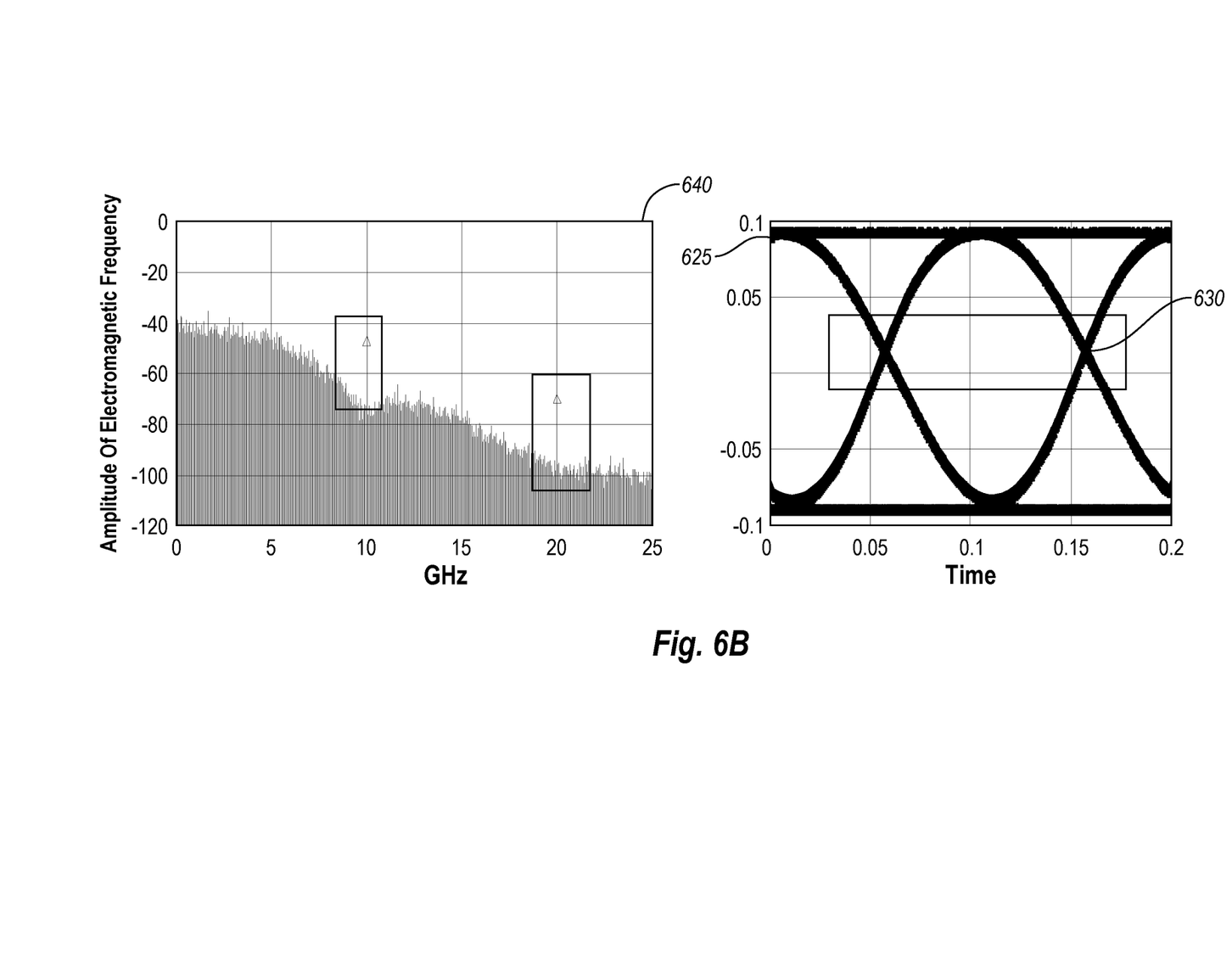
FIG. 6B illustrates a depiction of an electrical cross point level for another transmission signal and its associated electromagnetic radiation output profile.

In some embodiments, the control module 220 may make decisions to reduce the performance of the circuitry 230 and/or the optical subassembly 240 to reduce the electromagnetic radiation 204 from the circuitry 230 and/or the optical subassembly 240. For example, the control module 220 may reduce the electrical cross point level for transmission signals from an optimal level, such as 50%, to a less optimal level to achieve the best performance for signal transmission while reducing the electromagnetic radiation 204 from the circuitry 230 and/or the optical subassembly 240. For example, FIGS. 6A and 6B illustrate a depiction of electrical cross point levels for transmission signals and their associated electromagnetic radiation output profiles.

In some embodiments, the control module 220 receives measurements of the electromagnetic radiation 204 from the electromagnetic radiation detection module 210 while the control module 220 is configuring the circuitry 230 after power-up and before signal transmission and/or reception. In these and other embodiments, the control module 220 may use the received measurements of the electromagnetic radiation 204 to configure the circuitry 230 for proper operation while maintaining the electromagnetic radiation 204 emanating from the circuitry 230 below a predetermined threshold.

For example, in some embodiments, the control circuitry 220 may set the electrical settings of the circuitry 220 at an initial setting. The electromagnetic radiation detection module 210 may detect the electromagnetic radiation 204 from the circuitry and measure an amplitude of the electromagnetic radiation 204. The electromagnetic radiation detection module 210 may send the measured amplitude of the electromagnetic radiation 204 to the control module 220. The control module 220 may adjust one or more electrical settings of the circuitry 230 in an effort to reduce the amplitude of the electromagnetic radiation 204 emanating from the circuitry 230. The control module 220 may continue to receive the measured amplitude of the electromagnetic radiation 204 from the electromagnetic radiation detection module 210 and adjust the electrical settings of the circuitry 230 until a predetermined performance level of the circuitry 230 and/or predetermined amplitude of the electromagnetic radiation 204 is met. As described, the electromagnetic radiation detection module 210, the control module 220, and the circuitry 230 may operate together in a closed loop configuration.

In some embodiments, the control module 220 receives measurements of the electromagnetic radiation 204 from the electromagnetic radiation detection module 210 while the control module 220 is determining initial settings for the circuitry 230 after manufacturing of the circuitry 230. In these and other embodiments, the control module 220 may use the received measurements of the electromagnetic radiation 204 to configure the circuitry 230 for proper operation while maintaining the electromagnetic radiation 204 emanating from the circuitry 230 below a predetermined threshold. In these and other embodiments, the control module 220 may send the received measurements of the electromagnetic radiation 204 to a user. The user may send circuit configuration instructions to the control module 220 that may be used to configure the circuitry 230.

In some embodiments, the control module 220 receives measurements, such as an amplitude, of the electromagnetic radiation 204 from the electromagnetic radiation detection module 210 while the control module 220 is monitoring the circuitry 230 after the system 200 is powered-up and transmitting and/or receiving signals. Similar to the method as described above, the electromagnetic radiation detection module 210, the control module 220, and the circuitry 230 may operate in a closed loop configuration. In these and other embodiments, when an amplitude of the electromagnetic radiation 204 is above a threshold, the control module 220 may adjust the electrical settings of the circuitry 230 accordingly to reduce the amplitude of the electromagnetic radiation 204.

Figure 3:
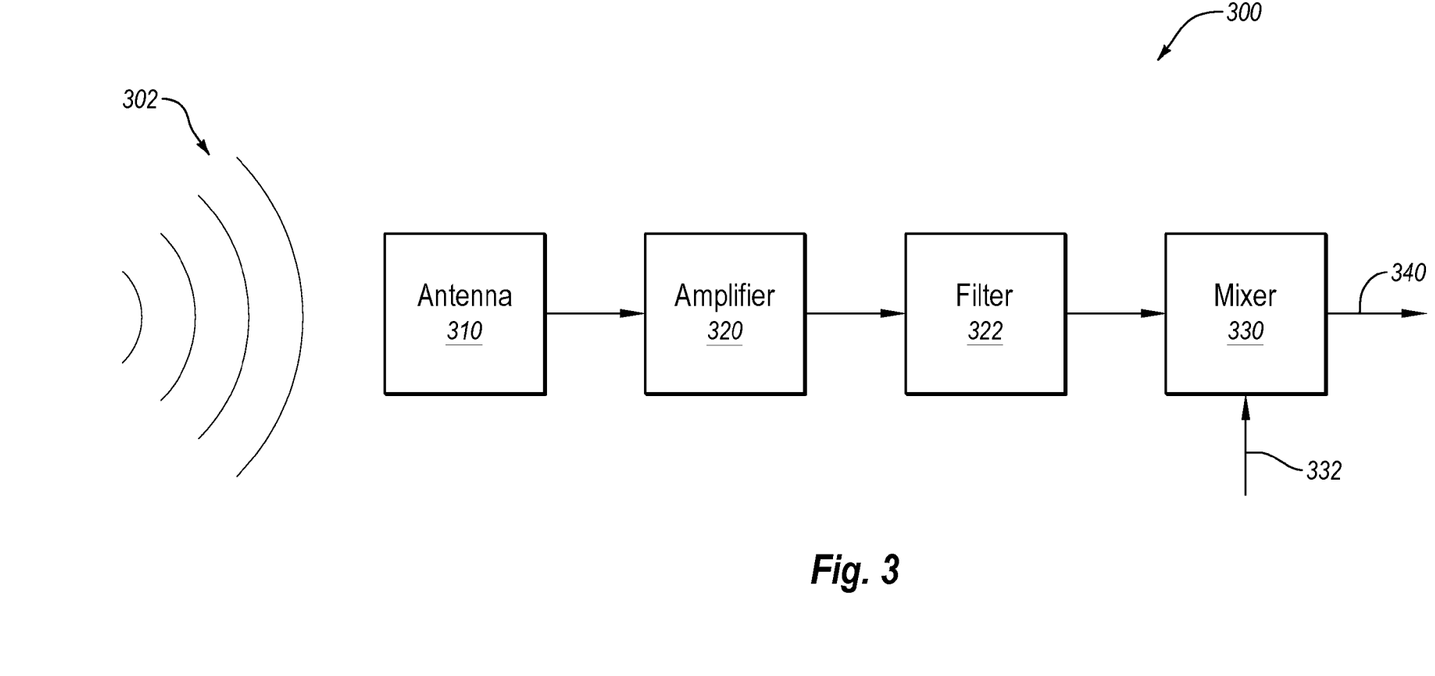
FIG. 3 illustrates an example electromagnetic radiation detection module.

FIG. 3 illustrates an example electromagnetic radiation detection module 300, arranged in accordance with at least some embodiments described herein. The electromagnetic radiation detection module 300 may be configured to detect electromagnetic radiation 302 and measure the electromagnetic radiation 302. The electromagnetic radiation detection module 300 may be part of an electromagnetic radiation compensation system, such as the system 200 of FIG. 2. For instance, the electromagnetic radiation detection module 300 may correspond to the electromagnetic radiation detection module 210 of FIG. 2.

The electromagnetic radiation detection module 300 may include an antenna 310, an amplifier 320, a filter 322, and a mixer 330. The antenna 310 may receive the electromagnetic radiation 302 and convert the electromagnetic radiation 302 to an electrical signal representative of the electromagnetic radiation 302. The antenna 310 may send the electrical signal to an amplifier 320 that may amplify all of or a portion of the frequencies in the electrical signal. The amplifier 320 may pass the amplified electrical signal to a filter 322. The filter 322 may be a bandpass filter. The band of frequencies passed by the filter 322 may correlate to the frequency of the electromagnetic radiation 302 that is being detected and for which a measurement is being taken. In some embodiments, the band of frequencies may include the frequency of a clock used by a circuit that produces the electromagnetic radiation 302. For example, if the electromagnetic radiation detection module 300 was part of the system 200 illustrated in FIG. 2, the band of frequencies may include the frequency of the clock used by the circuitry 230 illustrated in FIG. 2.

The amplified and filtered electrical signal is passed to the mixer 330. The mixer 330 may mix the electrical signal with a mixer signal 332. In some embodiments, the mixer signal 332 may have a frequency equal to the frequency of electromagnetic radiation 302 that is being detected by the electromagnetic radiation detection module 300. As a result, the mixer 330 may output a signal 340 that is equal to the DC component of the electromagnetic radiation 302 at the frequency being detected. This output signal 340 may represent the measurement of the electromagnetic radiation at the frequency being detected.

In some embodiments, the mixer signal 332 may be generated by a voltage controlled oscillator (VCO) specifically for the electromagnetic radiation detection module 300. Optionally, the VCO may be included in the electromagnetic radiation detection module 300, and/or in a control module of a corresponding electromagnetic radiation compensation system, such as the control module 220 of the system 200 of FIG. 2, or the like. Additionally or alternately, the mixer signal 332 may be a clock signal from another circuit, such as a clock data recovery circuit. For example, if the electromagnetic radiation detection module 300 were used in the system 200 as the electromagnetic radiation detection module 210 of FIG. 2, a clock used by the circuitry 230 of FIG. 2 may be used as the mixer signal 332.

In some embodiments, the amplifier 320 and the filter 322 may be implemented using a single discreet component or multiple discreet components. In some embodiments, the electromagnetic radiation detection module 300 may not include an amplifier or filter. In some embodiments, the antenna 310 may be implemented using a printed antenna or another form of antenna. Additionally or alternately, the antenna 310 may be a patch antenna, a dipole antenna, a loop antenna, a square antenna, or some other type of antenna or antenna configuration. In some embodiments, the output 340 may be further filtered in the analog domain or the output 340 may be digitally converted and filtered digitally. In some embodiments, the electrical signal produced by the antenna 310 may be digitized and the amplifier 320, the filter 322, and the mixer 322 may be digital. Various other configurations may be used to measure the electromagnetic radiation 302, using either analog or digital components or a combination of both.

In some embodiments, the electromagnetic radiation detection module 300 may be reconfigurable to allow the electromagnetic radiation detection module 300 to measure the electromagnetic radiation at varying frequencies. For example, a reconfigurable electromagnetic radiation detection module 300 may be used in a system where the highest amplitude of electromagnetic radiation may change frequencies. Such a system may include systems with variable clocks. Additionally or alternately, a reconfigurable electromagnetic radiation detection module 300 may be used to measure the electromagnetic radiation at a range of frequencies such as at a clock frequency and at harmonic frequencies of the clock frequency.

In these and other embodiments, the antenna 310 of the reconfigurable electromagnetic radiation detection module 300 may contain switches, such as a field effect transistor switches, that switch in additional lengths to change the range of frequencies received by the antenna 310. Additionally or alternately, the antenna 310 may contain switches, such as microelectromechanical switches, that switch in different potential portions of the antenna to change the shape of the antenna to optimize the antenna for a specific frequency. The amplifier 320 and filter 322 may also be adjustable within a range of frequencies for which the electromagnetic radiation detection module 300 may be configured. The mixer signal 332 may also be adjusted to a frequency for which the measurement of electromagnetic radiation is being taken.

In some embodiments, the reconfigurable electromagnetic radiation detection module 300 may measure the electromagnetic radiation at multiple frequencies in a cyclic manner. For example, the reconfigurable electromagnetic radiation detection module 300 may measure the electromagnetic radiation at a first frequency for first period, at a second frequency for a second period, and at a third frequency for a third period and then repeat this process. In this manner, the reconfigurable electromagnetic radiation detection module 300 may output the measurements of the electromagnetic radiation at multiple frequencies.

Figure 4:
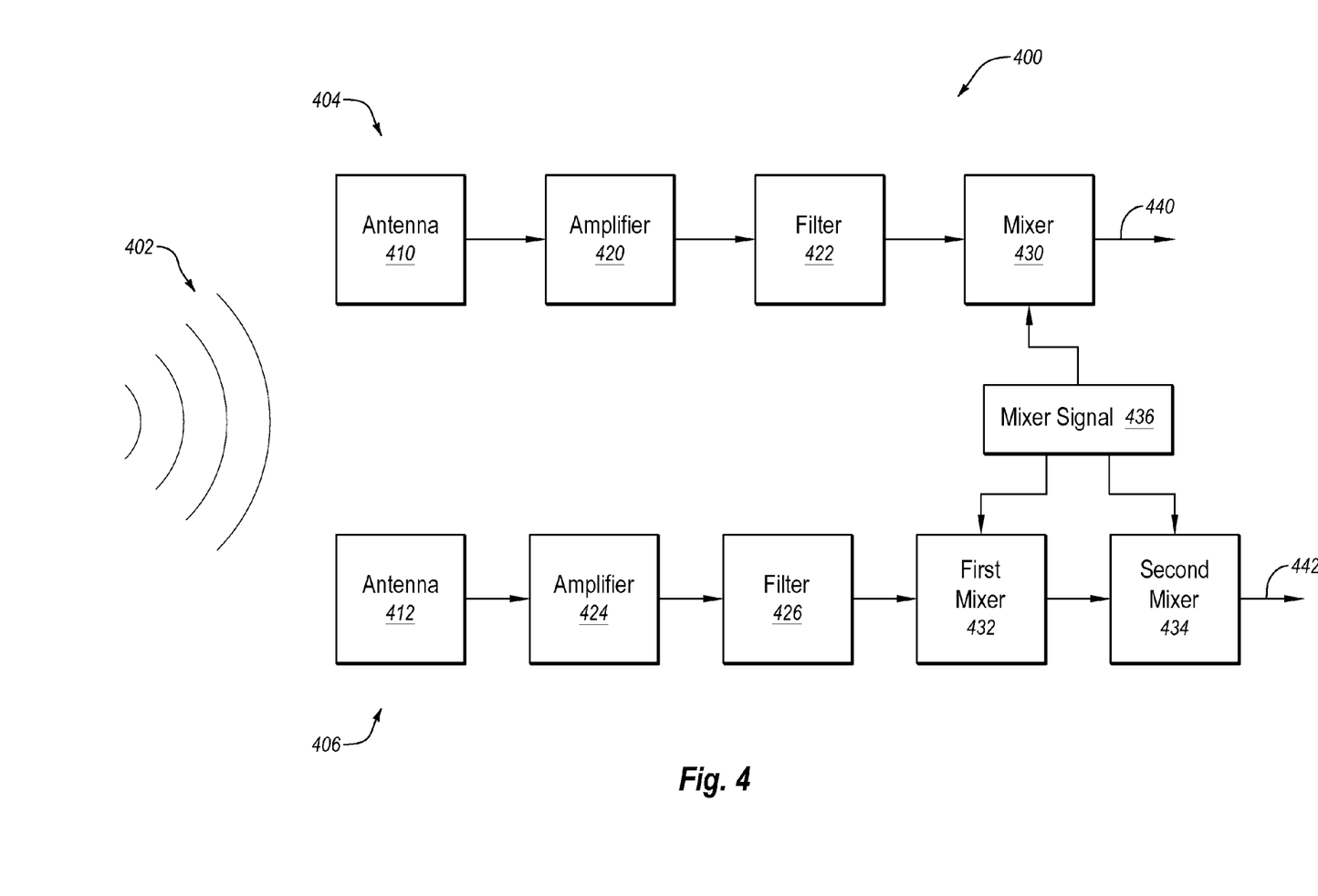
FIG. 4 illustrates another example electromagnetic radiation detection module.

FIG. 4 illustrates another example electromagnetic radiation detection module 400, arranged in accordance with at least some embodiments described herein. The electromagnetic radiation detection module 400 may be configured to detect electromagnetic radiation 402 and measure the electromagnetic radiation 402. The electromagnetic radiation detection module 400 may be part of an electromagnetic radiation compensation system, such as the system 200 of FIG. 2. For instance, the electromagnetic radiation detection module 400 may correspond to the electromagnetic radiation detection module 210 of FIG. 2.

The electromagnetic radiation detection module 400 may be configured to measure the electromagnetic radiation 402 at two distinct frequencies simultaneously. Specifically, the electromagnetic radiation detection module 400 may be configured to measure the electromagnetic radiation 402 at a frequency and a harmonic of the frequency.

The electromagnetic radiation detection module 400 may include a first arm 404 and a second arm 406, each of which may measure the electromagnetic radiation 402 at a single frequency. The first arm 404 may include an antenna 410, an amplifier 420, a filter 422, and a mixer 430 and may output an output signal 440. The second arm 406 may include an antenna 412, an amplifier 424, a filter 426, a first mixer 432, and a second mixer 434 and may output an output signal 442.

The antenna 410, the amplifier 420, the filter 422, and the mixer 430 of the first arm 404 may be configured to detect and measure the electromagnetic radiation 402 at a first frequency. The antenna 410 may receive the electromagnetic radiation 402 and convert the electromagnetic radiation 402 to an electrical signal. The first frequency and frequencies surrounding the first frequency in the electrical signal may be amplified by the amplifier 420. The filter 422 may be a bandpass filter that passes the first frequency and frequencies surrounding the first frequency. After filtering by the filter 422, the electrical signal is mixed in the mixer 430 with the mixer signal 436 to produce the output 440. The output 440 may be a signal that represents the measurement of the electromagnetic radiation 402 at the first frequency.

The antenna 412, the amplifier 422, the filter 426, the first mixer 432, and the second mixer 434 of the second arm 406 may be configured to detect and measure the electromagnetic radiation 402 at a second frequency that is a harmonic of the first frequency. In particular, the second frequency may be a harmonic that is double the first frequency. The antenna 412 may receive the electromagnetic radiation 402 and convert the electromagnetic radiation 402 to an electrical signal. The second frequency and frequencies surrounding the second frequency in the electrical signal may be amplified by the amplifier 424. The filter 426 may be a bandpass filter that passes the second frequency and frequencies surrounding the second frequency. After filtering by the filter 426, the electrical signal is mixed in the first mixer 432 with the mixer signal 436 and then mixed again in the second mixer 434 with the mixer signal 436 to produce the output 442. The output 442 may be a signal that represents the measurement of the electromagnetic radiation 402 at the second frequency.

In some embodiments, the mixer signal 436 may be generated by a VCO specifically for the electromagnetic radiation detection module 400. Additionally or alternatively, the mixer signal 436 may be a clock signal from another circuit. For example, if the electromagnetic radiation detection module 400 were used in the system 200 as the electromagnetic radiation detection module 210 of FIG. 2, a clock used by the circuitry 230 of FIG. 2 may be used as the mixer signal 436.

In some embodiments, the amplifier 420 and the filter 422 may be implemented using a single discreet component or multiple discreet components. In some embodiments, the amplifier 424 and the filter 426 may be implemented using a single discreet component or multiple discreet components. In some embodiments, the electromagnetic radiation detection module 400 may not include an amplifier or filter. In some embodiments, the antennas 410, 412 may each be implemented using a printed antenna or another form of antenna. Additionally or alternatively, the antennas 410, 412 may each include a patch antenna, a dipole antenna, a loop antenna, a square antenna, or some other type of antenna or antenna configuration. Additionally or alternatively, the antennas 410, 412 may be the same type of antennas or different types of antennas. In some embodiments, the outputs 440, 442 may be further filtered in the analog domain or the outputs 440, 442 may be digitally converted and filtered digitally. In some embodiments, the electrical signal produced by each of the antennas 410, 412 may be digitized and the remaining components may be digital. Various other configurations may be used to measure the electromagnetic radiation 402, using either analog or digital components or combinations of both. In some embodiments, the first and second arms 404, 406 may be reconfigurable as described with respect to the electromagnetic radiation detection module 300 of FIG. 3.

Figure 5:
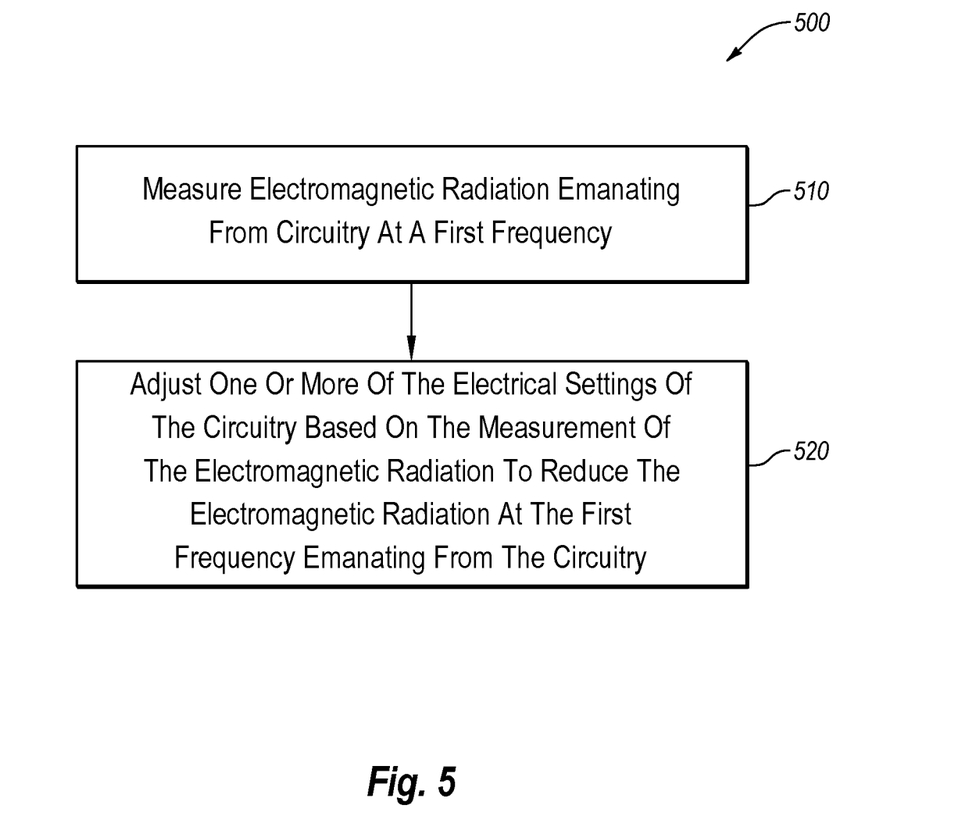
FIG. 5 is a flowchart of an example method of compensating for electromagnetic radiation.

FIG. 5 is a flowchart of an example method 500 of compensating for electromagnetic radiation, arranged in accordance with at least some embodiments described herein. The method 500 may be implemented, in some embodiments, by an electromagnetic radiation compensation system, such as the electromagnetic radiation compensation system 200 of FIG. 2.

The method 500 may begin at block 510, in which electromagnetic radiation emanating from circuitry at a first frequency may be measured. In some embodiments, the first frequency may approximately equal the clock frequency used by the circuitry. Additionally or alternatively, the circuitry emanating the electromagnetic radiation may be configured to receive signals from or transmit signals to an optical subassembly. Additionally or alternatively, the electromagnetic radiation may be measured by an electromagnetic radiation detection module that may include an antenna, a filter, and a mixer, such as the electromagnetic radiation detection modules 210, 300, 400 of FIGS. 2-4. In some embodiments, the measurement of the electromagnetic radiation may be an amplitude of the electromagnetic radiation.

In block 520, one or more of the electrical settings of the circuitry may be adjusted based on the measurement of the electromagnetic radiation to reduce the electromagnetic radiation at the first frequency emanating from the circuitry. In some embodiments, the electrical settings of the circuit may be adjusted while the control module is configuring the electrical settings of the circuit during power-up of the circuitry. Additionally or alternatively, the electrical settings of the circuitry may be adjusted while initial parameters of the circuitry are being set. Additionally or alternatively, the electrical settings of the circuitry may be adjusted while the circuitry is receiving signals from or transmitting signals to an optical subassembly. For example, the block 510 may be performed periodically or constantly so that the control module receives periodic or constant updates of the measurements of electromagnetic radiation emanating from the circuitry. Based on the measurements of the electromagnetic radiation, the control module may adjust one or more electrical settings of the circuitry to reduce the electromagnetic radiation emanating from the circuitry while the circuitry is receiving signals from or transmitting signals to an optical subassembly. In some embodiments, adjusting the one or more electrical settings may decrease the performance of the circuitry. In these and other embodiments, adjusting the one or more electrical settings may require a trade-off between performance of the circuitry and the electromagnetic radiation emanating from the circuitry.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For instance, the method 500 may further include sending the measurement of the electromagnetic radiation at the first frequency to a control module that controls electrical settings of the circuit. In some embodiments, the electrical settings of the circuit may include one or more of modulation levels, signal amplitude levels, electrical cross point levels, signal rise time, signal fall time, signal overshoot, signal undershoot, receiver sensitivity, voltage biasing levels, or other electrical settings. In some embodiments, the electromagnetic radiation detection module, the control module, and the circuitry may be coupled to a single printed circuit board.

In some embodiments, the method 500 may further include mixing a received electromagnetic radiation signal with a clock signal from the circuitry. In some embodiments, mixing the received electromagnetic radiation signal with a clock signal may generate a DC signal that represents the amplitude of the electromagnetic radiation at the frequency of the clock signal.

FIG. 6A illustrates a depiction of an electrical cross point level 610 for a transmission signal 605 and its associated electromagnetic radiation output profile 612, arranged in accordance with at least some embodiments described herein. As depicted in FIG. 6A, the cross point level 610 of the transmission signal 605 may be configured with no offset.

FIG. 6B illustrates a depiction of an electrical cross point level 630 for a transmission signal 625 and its associated electromagnetic radiation output profile 640, arranged in accordance with at least some embodiments described herein. As depicted in FIG. 6B, the cross point level 630 of the transmission signal 625 may be offset to achieve optimal data transmissions. In some embodiments, as illustrated by the electromagnetic radiation output profile 640, the offset cross point level 630 may lead to increased electromagnetic radiation at certain frequencies. For example, as illustrate in the electromagnetic radiation output profile 640, the amplitude or field intensity of electromagnetic radiation caused by circuitry generating the transmission signal 625 may spike at 10 gigahertz and at 20 gigahertz as compared to the electromagnetic radiation output profile 612 of FIG. 6A where the cross point level 610 is not offset. In some embodiments, the transmission signal 625 may be generated by circuitry with a 10 gigahertz clock. In these and other embodiments, the cross point level 630 may be reduced to non-optimal levels to reduce the spikes of electromagnetic radiation at 10 gigahertz and at 20 gigahertz in the electromagnetic radiation output profile 640.

FIGS. 6A and 6B are provided to illustrate how adjustments in electrical circuitry of a transmitter or receiver may cause changes in electromagnetic radiation emitted from the electrical circuitry. FIGS. 6A and 6B illustrate a single example and are not limiting. In some embodiments, other adjustments to transmitter and receiver circuitry may cause changes in electromagnetic radiation emissions.

The present invention may be embodied in other specific forms. The described example embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method to compensate for electromagnetic radiation, the method comprising:
   converting an optical signal into an electrical signal using an optical subassembly;
   conditioning the electrical signal with circuitry that does not include the optical subassembly, wherein operation of the circuitry results in generation of electromagnetic radiation that is different from the optical signal and not carried by the optical subassembly;
   measuring the electromagnetic radiation emanating from the circuitry at a first frequency using at least an antenna; and
   adjusting at least one electrical setting of the circuitry based on the measurement of the electromagnetic radiation to reduce the electromagnetic radiation emanating from the circuitry at the first frequency.

2. The method of claim 1, wherein the first frequency approximately equals a clock frequency used by the circuitry.

3. The method of claim 1, wherein the adjusted electrical setting comprises at least one of: modulation level, signal amplitude level, electrical cross point level, signal rise time, signal fall time, signal overshoot, signal undershoot, receiver sensitivity, and voltage biasing level.

4. The method of claim 1, wherein the circuitry is configured to extract data from an electrical signal, wherein adjusting the at least one of the electrical settings of the circuitry affects an ability of the circuitry to extract the data from the electrical signal.

5. The method of claim 1, further comprising sending the measurement of the electromagnetic radiation at the first frequency to a control module that controls electrical settings of the circuitry.

6. The method of claim 1, wherein the electromagnetic radiation emanating from the circuitry is measured at a plurality of frequencies that includes the first frequency, wherein each of the plurality of frequencies besides the first frequency is a harmonic of the first frequency.

7. The method of claim 6, wherein adjusting the at least one of the electrical settings of the circuitry affects the electromagnetic radiation at the plurality of frequencies.

8. A system comprising:
   an optical subassembly configured to carry a plurality of optical signals;
   circuitry different from the optical subassembly and configured to include one or more of a first electrical signal and a second electrical signal, wherein the first electrical signal is generated based on one of the plurality of optical signals and another of the plurality of optical signals is generated based on the second electrical signal, wherein operation of the circuitry results in generation of electromagnetic radiation that is different from the plurality of optical signal and not carried by the optical subassembly;
   an electromagnetic radiation detection module that includes an antenna, the electromagnetic radiation detection module configured to detect the electromagnetic radiation emanated from the circuitry and measure the electromagnetic radiation; and
   a control module configured to control electrical settings of the circuitry, the control module further configured to adjust at least one of the electrical settings of the circuitry to reduce the electromagnetic radiation emanating from the circuitry based on the measurement of the electromagnetic radiation.

9. The system of claim 8, wherein the electromagnetic radiation detection module is configured to measure the electromagnetic radiation emanating from the circuitry at a first frequency, wherein the first frequency is approximately equal to a clock frequency of a clock signal used by the circuitry.

10. The system of claim 8, wherein the electromagnetic radiation detection module is configured to measure the electromagnetic radiation emanating from the circuitry at a plurality of frequencies, wherein the plurality of frequencies include a first frequency and other of the plurality of frequencies that do not include the first frequency are harmonics of the first frequency.

11. The system of claim 8, wherein the electrical settings adjusted by the control module comprise at least one of: modulation level, signal amplitude level, electrical cross point level, signal rise time, signal fall time, signal overshoot, signal undershoot, receiver sensitivity, or voltage biasing level.

12. The system of claim 8, wherein the circuitry, the control module, and the electromagnetic radiation detection module are coupled to a single printed circuit board.

13. The system of claim 8, wherein the antenna is configured to receive the electromagnetic radiation emanated from the circuitry and convert the electromagnetic radiation to an electrical signal representative of the electromagnetic radiation, and the electromagnetic radiation detection module further comprises:
   a mixer configured to receive an electrical signal from the antenna and to mix the electrical signal with a mixing signal to generate a signal representing an amplitude of the electromagnetic radiation.

14. The system of claim 13, wherein the mixing signal is a clock signal used in the circuitry.

15. A method to compensate for electromagnetic radiation, the method comprising:
- converting an electrical signal into an optical signal using an optical subassembly;
- conditioning the electrical signal with circuitry before converting the electrical signal, wherein the circuitry does not include the optical subassembly and operation of the circuitry results in generation of electromagnetic radiation that is different from the optical signal and not carried by the optical subassembly;
- measuring the electromagnetic radiation emanating from the circuitry at a first frequency using at least an antenna; and
- adjusting at least one electrical setting of the circuitry based on the measurement of the electromagnetic radiation to reduce the electromagnetic radiation emanating from the circuitry at the first frequency.

16. The method of claim 15, wherein the first frequency approximately equals a clock frequency used by the circuitry.

17. The method of claim 15, wherein the adjusted electrical setting comprises at least one of: modulation level, signal amplitude level, electrical cross point level, signal rise time, signal fall time, signal overshoot, signal undershoot, receiver sensitivity, and voltage biasing level.

18. The method of claim 15, further comprising sending the measurement of the electromagnetic radiation at the first frequency to a control module that is configured to control the at least one of the electrical settings of the circuitry.

19. The method of claim 15, wherein the electromagnetic radiation emanating from the circuitry is measured at a plurality of frequencies that includes the first frequency, wherein other of the plurality of frequencies that do not include the first frequency are harmonics of the first frequency.

20. The method of claim 19, wherein adjusting the at least one of the electrical settings of the circuitry affects the electromagnetic radiation at the plurality of frequencies.

* * * * *

UNITED STATES PATENT AND TRADEMARK OFFICE
CERTIFICATE OF CORRECTION

PATENT NO.        : 9,103,725 B2                                     Page 1 of 1
APPLICATION NO.   : 13/761328
DATED             : August 11, 2015
INVENTOR(S)       : Daghighian et al.

It is certified that error appears in the above-identified patent and that said Letters Patent is hereby corrected as shown below:

Specification

In Column 6, Line 2, delete "circuitry 220" and insert -- circuitry 230 --, therefor.

In Column 7, Line 54, delete "mixer 322" and insert -- mixer 330 --, therefor.

In Column 9, Line 1, delete "amplifier 422," and insert -- amplifier 424, --, therefor.

Claims

In Column 12, Line 9, in Claim 8, delete "system" and insert -- system, --, therefor.

Signed and Sealed this
Fifth Day of July, 2016

Michelle K. Lee
*Director of the United States Patent and Trademark Office*